United States Patent
Su et al.

(10) Patent No.: US 11,550,229 B1
(45) Date of Patent: Jan. 10, 2023

(54) ENHANCING LITHOGRAPHY OPERATION FOR MANUFACTURING SEMICONDUCTOR DEVICES

(71) Applicant: TAIWAN SEMICONDUCTOR MANUFACTURING COMPANY, LTD., Hsinchu (TW)

(72) Inventors: Yi-Chen Su, Taichung (TW); Tzu-Yi Wang, Hsinchu (TW); Ta-Cheng Lien, Cyonglin Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/351,948

(22) Filed: Jun. 18, 2021

(51) Int. Cl.
    *G03F 7/20* (2006.01)
(52) U.S. Cl.
    CPC ...... *G03F 7/70625* (2013.01); *G03F 7/70033* (2013.01); *G03F 7/70741* (2013.01)
(58) Field of Classification Search
    CPC ............. G03F 7/70625; G03F 7/70033; G03F 7/70741; G03F 1/82; G03F 1/24
    See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 2016/0370697 A1* | 12/2016 | Oshemkov | G03F 1/22 |
| 2020/0050118 A1 | 2/2020 | Chang et al. | |

FOREIGN PATENT DOCUMENTS

| | | |
|---|---|---|
| CN | 102078896 B | 4/2013 |
| TW | I339317 B | 3/2011 |
| TW | 201907445 A | 2/2019 |
| TW | I650415 B | 2/2019 |

\* cited by examiner

*Primary Examiner* — Peter B Kim
(74) *Attorney, Agent, or Firm* — McDermott Will & Emery LLP

(57) ABSTRACT

A method of treating a surface of a reticle includes retrieving a reticle from a reticle library and transferring the reticle to a treatment device. The surface of the reticle is treated in the treatment device by irradiating the surface of the reticle with UV radiation while ozone fluid is over the surface of the reticle for a predetermined irradiation time. After the treatment, the reticle is transferred to an exposure device for lithography operation to generate a photo resist pattern on a wafer. A surface of the wafer is imaged to generate an image of the photo resist pattern on the wafer. The generated image of the photo resist pattern is analyzed to determine critical dimension uniformity (CDU) of the photo resist pattern. The predetermined irradiation time is increased if the CDU does not satisfy a threshold CDU.

20 Claims, 14 Drawing Sheets

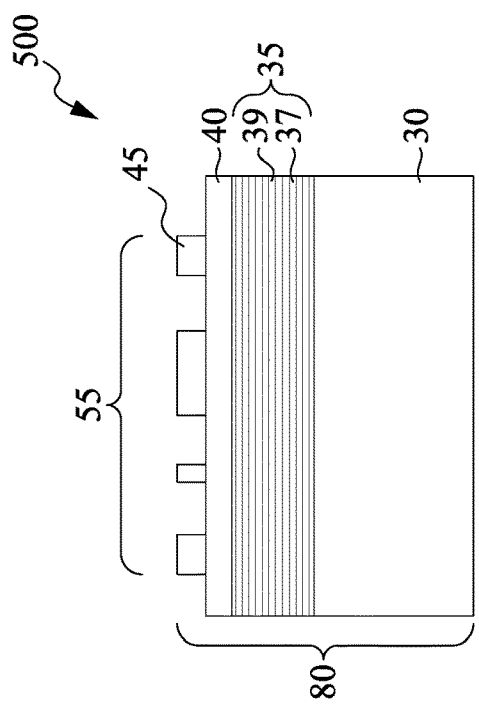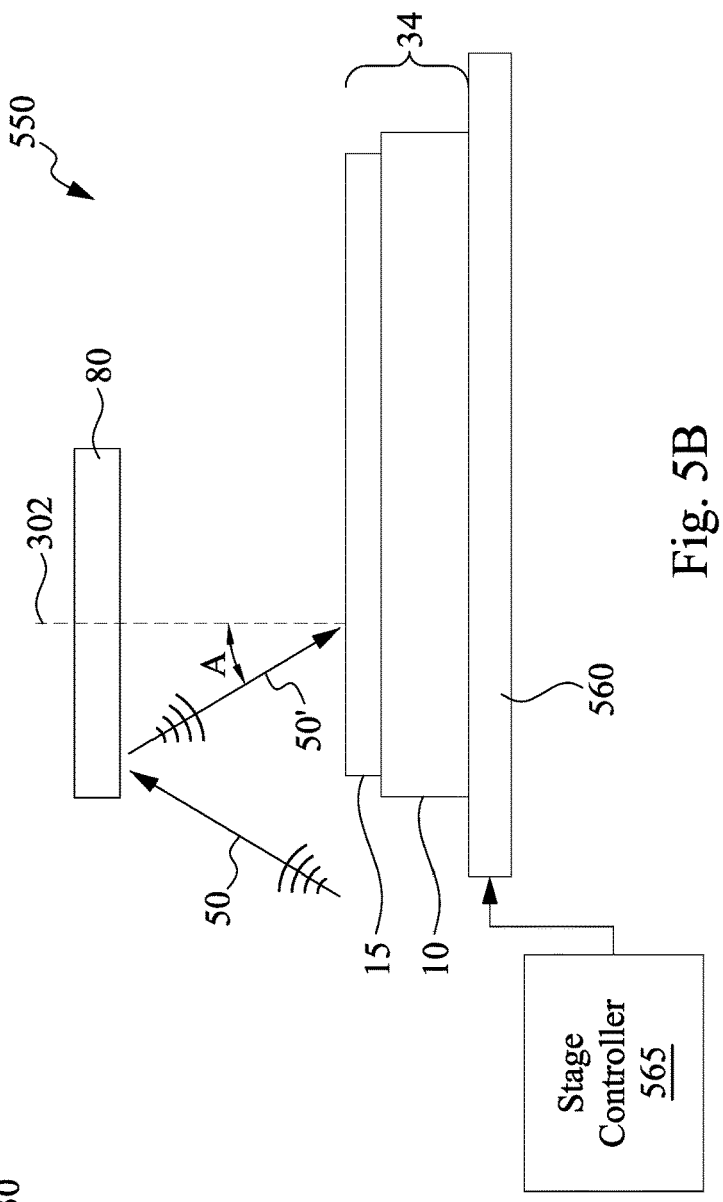
Fig. 5A
Fig. 5B

ENHANCING LITHOGRAPHY OPERATION FOR MANUFACTURING SEMICONDUCTOR DEVICES

BACKGROUND

During an integrated circuit (IC) design, a number of patterns of the IC, for different steps of IC processing, are generated on a substrate. The patterns may be produced by projecting, e.g., imaging, by extreme ultraviolet (EUV) radiation, layout patterns of a mask on a photo resist layer of the wafer. A lithographic process transfers the layout patterns of the reticles to the photo resist layer of the wafer such that etching, implantation, or other steps are applied only to predefined regions of the wafer. The reticles, e.g., the masks, may be stored in reticle libraries under a vacuum condition when the reticles are not used. It is desirable to treat the reticles to increase the reflectivity of the reticles after being retrieved from the reticle library and before being used for the lithographic process.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A and 5B show cross-sectional views of a reflective reticle structure and projecting the reflective reticle structure on a semiconductor device in an exposure device.

DETAILED DESCRIPTION

Figure 1:
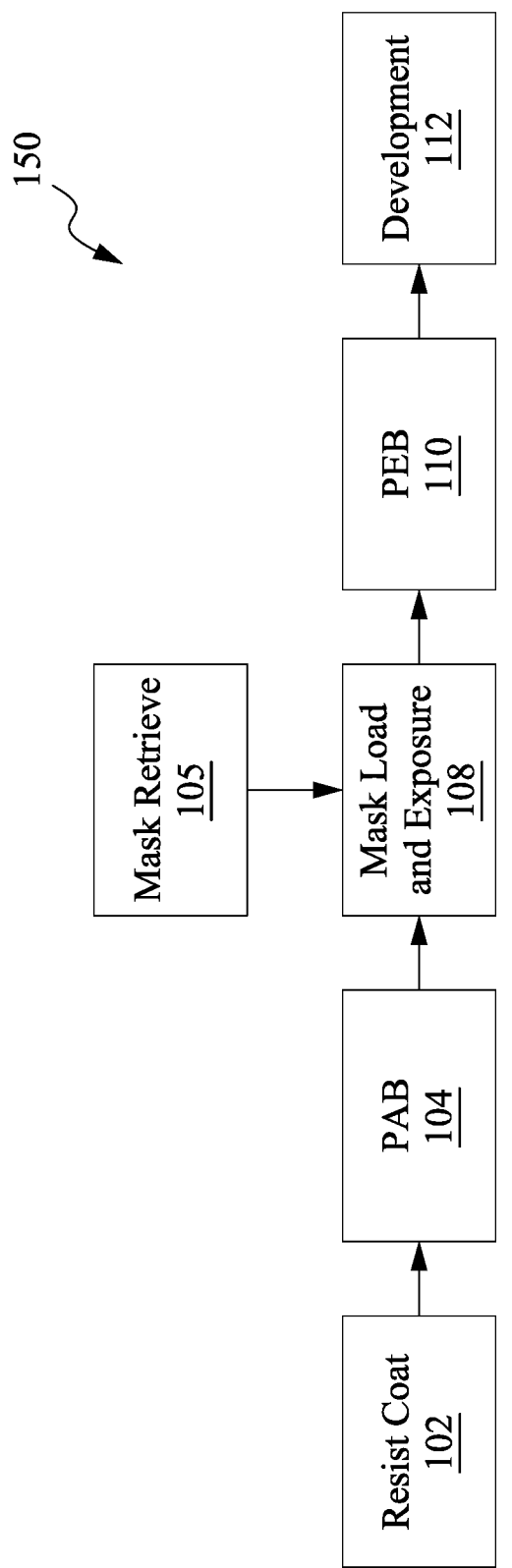
FIG. 1 shows a process flow for generating a photo resist pattern on a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the reticles are stored in the reticle library and the reticle library is maintained under vacuum condition to prevent the deposition of particles and hydrocarbon contamination on the reticles. However, when the reticle is used during a lithographic process, particles and hydrocarbon contamination may build up on the reticles. In addition, an oxide layer, e.g., an oxide of the absorption layer, may deposit on the top surface of reticle or the composition of the top layers of the reticle may modify. In addition to the particles and the hydrocarbon contamination, the deposited oxide layer and the change in the composition of the top layers of the reticle, may reduce the reflectivity of a reflective reticle and may affect, e.g., reduce, the critical dimension (CD) uniformity in the pattern produced on the photo resist layer of the wafer. In some embodiments, the reticle surfaces are cleaned from particles and hydrocarbon contamination with solvents after the reticle is retrieved from the reticle library. In some embodiments, the reticle surfaces are cleaned from particles and hydrocarbon contamination with solvents before the reticle is stored in the reticle library. Cleaning the reticles with solvents, may introduce other particles in the reticle library if the reticles is cleaned before being stored. Cleaning the reticles with solvents, may introduce other particles in the exposure device of the lithographic system if the reticle is cleaned after being retrieved from the reticle library. In addition, cleaning the reticle with solvents may introduce a long delay in the lithographic process. Thus, in some embodiments, the reticles are cleaned offline. The reticles are retrieved from the reticle library, the retrieved reticles are cleaned, and the reticles are stored again in the reticle library. Cleaning the reticles with solvents may not reduce the deposited oxide layer on top surface of the reticle and may not remedy the modified composition of the top layers of the reticle.

As discussed, when the reticles are retrieved from the reticle library and are used for the lithographic process, particles and/or hydrocarbon contamination can build up on the mask, an oxide layer may deposit on the top surface of reticle, and the composition of the top layers of the reticle may modify. Therefore, it is desirable to clean the reticles to remove the particles and/or hydrocarbon contamination before performing the lithographic process. In addition, it is desirable to treat the top layers of the reticle to remedy the deposited oxide and the modified composition of the top layers of the reticle. In some embodiments, the lithographic system includes a treatment device in addition to the exposure device. The exposure device is used for projecting the reticles on a photo resist layer of a wafer to pattern the wafer. The treatment device with an ozone fluid supply and a separate radiation source, e.g., a UV radiation source, is used for irradiating a surface layer of the reticle and treating the surface layer of the reticle when ozone fluid, e.g., ozone water or ozone gas is released on the top surface of the reticle. In some embodiments, the energy of the irradiation is used to decompose the particles or a hydrocarbon contamination layer deposited on the surface layer of the reticle. In addition, the energy of the irradiation and the ozone fluid on top surface of the reticle may be used to remedy the deposited oxide and the modified composition of the top layers of the reticle. In addition, the more the surface layer of the reticle is irradiated, the more the particles and the hydrocarbon contamination layer are decomposed and the deposited oxide and the modified composition of the top layers of the reticle are affected. In some embodiments, the reticle is a reflective reticle and irradiating the surface layer of the reticle for a long time not only cause delay in the lithographic process, the extra irradiation may damage the layers of the reticle. Damaging the layers of the reticle, e.g., the reflective layers of the reflective reticle may damage CD uniformity. Therefore, it is desirable to irradiate the surface layer of the reticle to reduce or eliminate the effect of the particles and the hydrocarbon contamination and to remedy the deposited oxide and the modified composition of the top layers of the reticle but do not damage the structure, e.g., the reflective structure, of the reticle. Thus, it is desirable to irradiate the surface layer of the reticle to get an optimum improvement in CD uniformity (CDU) before damaging the reticle structure.

FIG. 1 shows a process flow 150 for generating a photo resist pattern on a semiconductor substrate. In some embodiments, the process flow 150 is performed by the control system 800 of FIG. 8 and/or the computer system 1000 of FIGS. 10A and 10B. In a resist coat operation 102, a resist layer of a resist material is disposed, e.g., coated, on a top surface of a substrate, e.g., a wafer or a work piece. As shown in FIG. 5B, a photo resist layer 15 is disposed over a semiconductor substrate 10. The post application bake (PAB) is performed at a PAB operation 104 and the semiconductor substrate 10 including the photo resist layer 15 is baked to drive out solvent in the resist material and solidify the photo resist layer 15 on top of the semiconductor substrate 10.

In the present disclosure, the terms mask, photomask, and reticle are used interchangeably. In addition, the terms resist and photo resist are used interchangeably. At a mask retrieve operation 105, a reticle is retrieved from a reticle library. The mask retrieve operation 105 is described in more details with respect to FIG. 2. The retrieved reticle is loaded by a mask load and exposure operation 108 to an exposure device, which is described with respect to FIG. 4. The mask load and exposure operation 108 also projects the mask, using actinic radiation of a radiation source onto the photo resist layer 15 of the semiconductor substrate 10. In some embodiments, a layout pattern on the mask is projected by an extreme ultraviolet (EUV) radiation from an EUV light source, having a wavelength of 13.5 nm, onto the photo resist layer 15 to generate a resist pattern in the photo resist layer 15 on the semiconductor substrate 10. A post exposure bake (PEB) is performed at a PEB operation 110 on the wafer where the resist layer is further baked after being exposed to the actinic radiation and before being developed in a development operation 112. By applying a developer solution to the photo resist layer 15, the resist material of the resist layer is developed. For a positive tone resist material, in the development operation 112, the exposed regions are developed by applying a developer solution and then the developed regions are removed and the remaining regions generate the resist pattern of the photo resist layer 15. For a negative tone resist material, in the development operation 112, the non-exposed regions are developed by applying the developer solution and the developed regions are subsequently removed and the remaining regions generate the resist pattern of the photo resist layer 15. The mask is described with respect to FIG. 5A.

Figure 2:
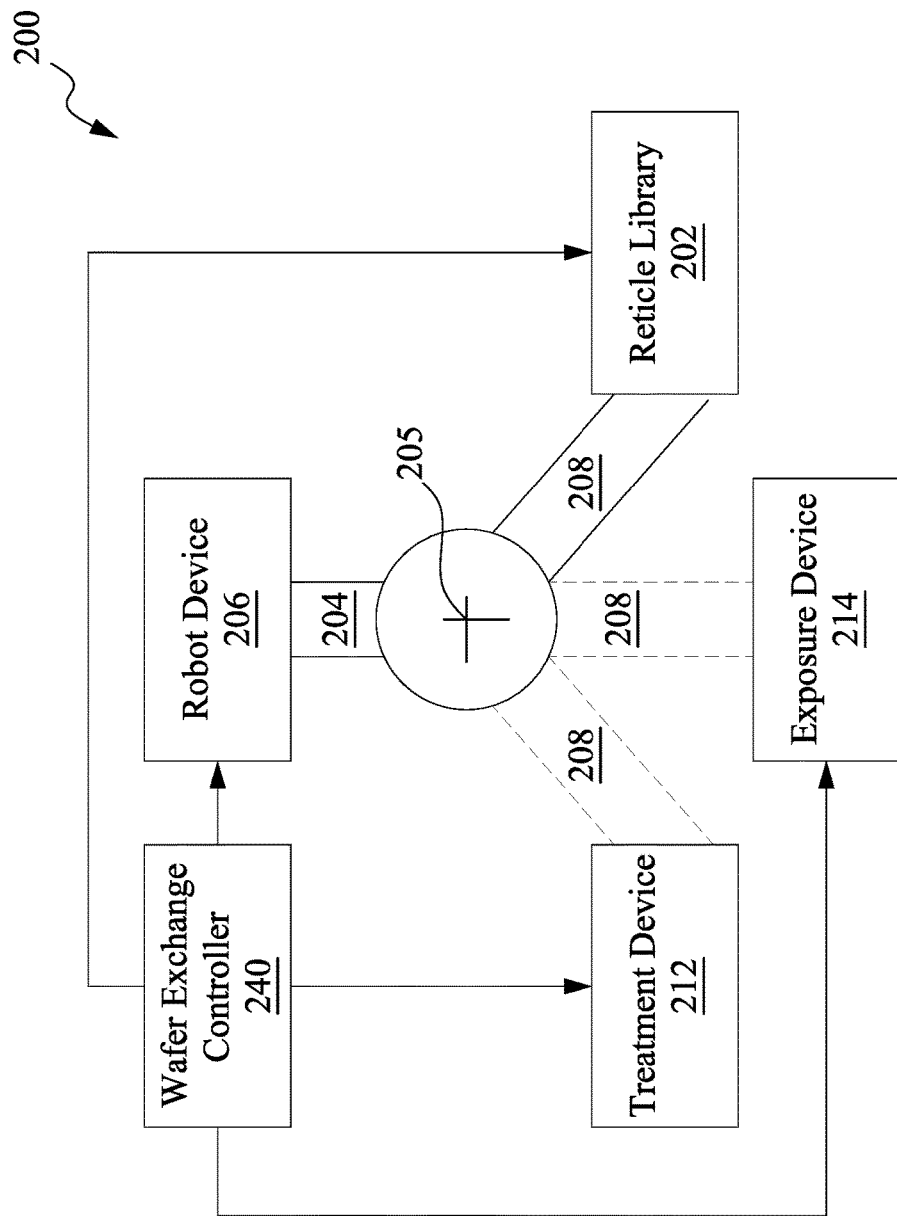
FIG. 2 shows a wafer exchange system for retrieving the reticles and treating the reticle in accordance with some embodiments of the present disclosure.

FIG. 2 shows a wafer exchange system 200 for transferring reticles between different positions. The wafer exchange system 200 transfers reticles between a reticle library 202, a treatment device 212 and an exposure device 214. The wafer exchange system 200 includes a robot device 206 with a robot arm. The robot arm includes a first movable segment 204 and a second movable segment 208. The second movable segment 208 rotates around the first pivot point 205. The first movable segment 204 rotates around a second pivot point (not shown) inside the robot device 206 and further moves the first pivot point and the second movable segment. The robot device 206 may rotate the first movable segment 204 and the second movable segment 208 around the respective pivot points to extend the robot arm to the reticle library 202, the treatment device 212, or the exposure device 214. In some embodiments, the robot device 206, the reticle library 202, the treatment device 212, and the exposure device 214 are maintained in vacuum condition.

The wafer exchange system 200 also includes a wafer exchange controller 240 coupled to the reticle library 202, the robot device 206, the treatment device 212, and the exposure device 214. In some embodiments, the wafer exchange controller 240 commands the robot device 206 to retrieve a reticle from the reticle library 202 and load the reticle to the treatment device 212 or the exposure device 214. In some embodiments, the wafer exchange controller 240 commands the robot device 206 to retrieve a reticle from the treatment device 212 and to load the reticle to the exposure device 214. In some embodiments, the wafer exchange controller 240 commands the robot device 206 to retrieve a reticle from the exposure device 214 and to load the reticle to the treatment device 212. In some embodiments, the wafer exchange controller 240 commands the reticle library 202 to release one of the reticles to be retrieved. In some embodiments, the wafer exchange controller 240 commands the robot device 206 to load the reticle on a reticle stage (not shown) of the treatment device 212 or the exposure device 214. The treatment devices 212 and the exposure device 214 are described with respect to FIGS. 4, 5B, and 7A.

Figure 3:
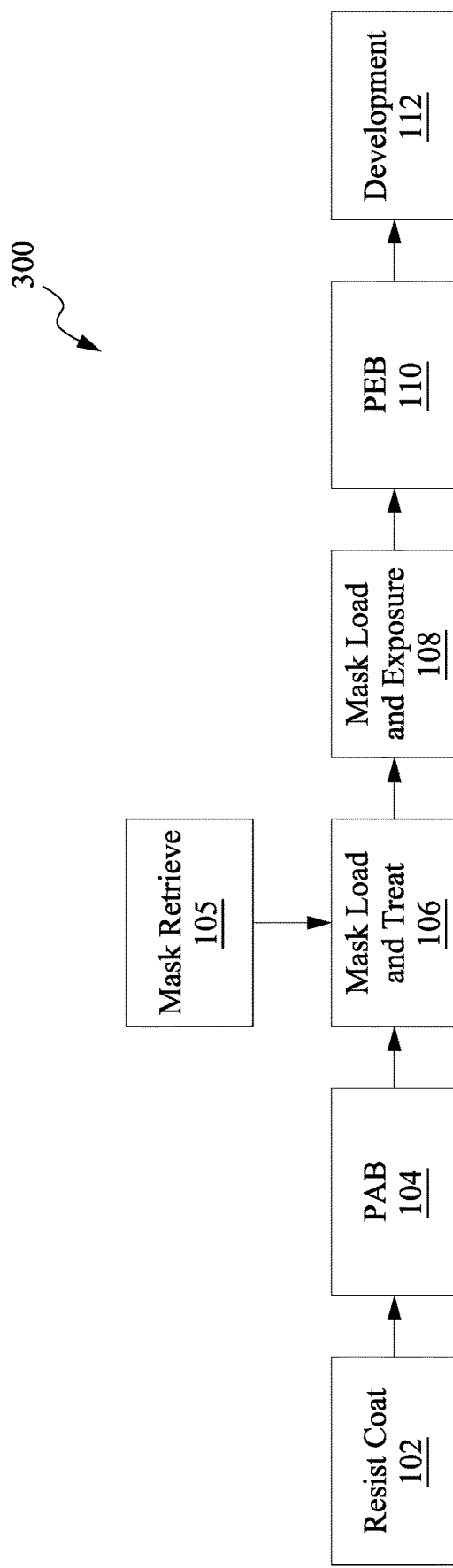
FIG. 3 shows a process flow for generating a photo resist pattern on a semiconductor substrate in accordance with some embodiments of the present disclosure.

FIG. 3 shows a process flow 300 for generating a photo resist pattern on a semiconductor substrate in accordance with some embodiments of the present disclosure. The process flow 300 includes the resist coat operation 102, the PAB operation 104, the PEB operation 110, and the development operation 112 of the process flow 150 of FIG. 1. In addition, the process flow 300 includes a mask retrieve operation 105, which is performed by the wafer exchange system 200 of FIG. 2. In the mask retrieve operation 105, the wafer exchange controller 240 of FIG. 2 commands the robot device 206 and the reticle library 202. In response to the commands from the wafer exchange controller 240, the reticle library 202 releases a reticle and the robot arm of the robot device 206 extends into the reticle library 202 and retrieves the released reticle. The process flow 300 also includes a mask load and treat operation 106. In the mask load and treat operation 106, the wafer exchange controller 240 commands the robot device 206 to load the released reticle in the treatment device 212. In addition, after the loading of the reticle in the treatment device 212, the wafer exchange controller 240 commands a radiation source, e.g., a light source of the treatment device 212 to irradiate the surface of the reticle with a radiation of the radiation source for a predetermined amount of time to clean the surface of the reticle from particles and/or hydrocarbon contamination and to remedy the deposited oxide and the modified composition of the top layers of the reticle as shown in FIGS. 7B, 7C, and 7D. In some embodiments, the radiation source of the treatment device 212 is a UV light source or another light source with suitable wavelength that may decompose the hydrocarbon contamination layer and the particles or may remedy the deposited oxide and the modified composition of the top layers of the reticle. In some embodiments, the surface of the reticle is a surface area of the reflective reticle that the radiation enters the reticle. In some embodiments, as at least part of the cleaning and treatment operations and to determine the irradiation time of the surface of the reticle, the reflected light from the reticle is focused onto a light detector and a signal proportional to the detected light is generated by the light detector. Also, in the mask load and exposure operation 108, the reticle loaded in the treatment device 212 is transferred to the exposure device 214 and a radiation source of the exposure device 214, projects the layout pattern of the reticle onto a photo resist layer of a substrate, e.g., the photo resist layer 15 of the semiconductor substrate 10 of FIG. 5B to generate a resist pattern.

Figure 4:
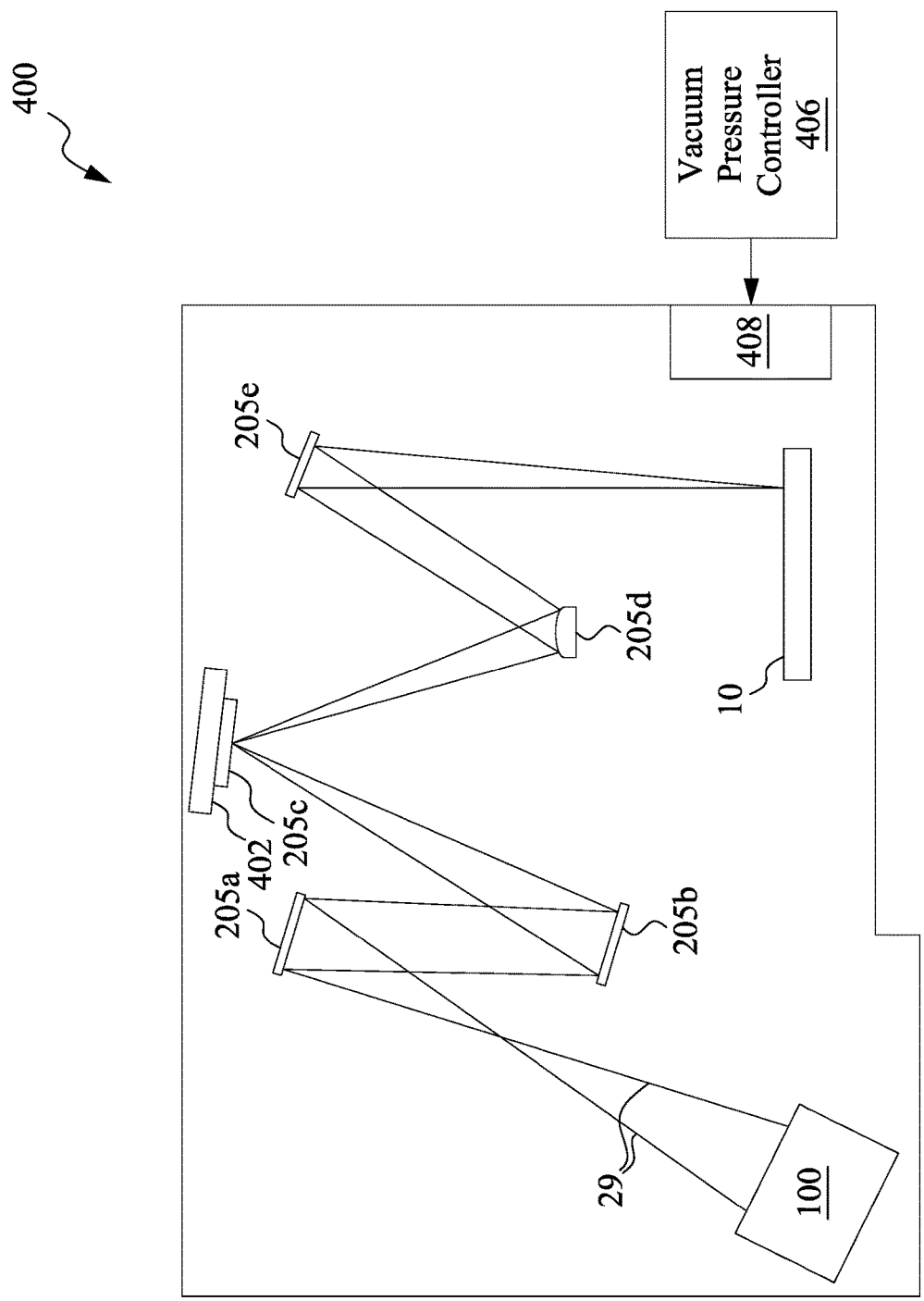
FIG. 4 shows a schematic view of an exposure device for generating a photo resist pattern on a wafer.

FIG. 4 shows a schematic view of an exposure device 400 for generating a photo resist pattern on a wafer. The exposure device 400, which is consistent with the exposure device 214 shows the exposure of a photo resist coated substrate with a patterned beam of radiation 29 from a radiation source 100, e.g., an EUV radiation source. In some embodiments, the exposure device 400 is an integrated circuit lithography tool such as a stepper, scanner, step and scan system, direct write system, device using a contact and/or proximity mask, etc., provided with one or more optics 205a, 205b of an optical system, for example, to illuminate a patterning optic, such as a reticle, e.g., a reflective mask 205c, with a beam of EUV radiation, to produce a patterned beam, and one or more reduction projection optics 205d, 205e, of the optical system for projecting the patterned beam onto the target semiconductor substrate 10. In some embodiments, the photo resist layer consistent with the photo resist layer 15 of FIG. 5B is disposed over the semiconductor substrate 10. A mechanical assembly (not shown) may be provided for generating a controlled relative movement between the target semiconductor substrate 10 and patterning optic, e.g., a reflective mask 205c. By the controlled relative movement, different dice of the substrate are patterned. In some embodiments, the exposure device 400 is an EUV lithography (EUVL) exposure device. As further shown, the EUVL exposure device of FIG. 4 further includes the EUV radiation source 100 to irradiate the target semiconductor substrate 10. In some embodiments, because gas molecules absorb EUV light, the lithography system for the EUV lithography patterning, e.g., the exposure device 400 is under a vacuum environment to avoid EUV intensity loss. In some embodiments, a pressure inside the exposure device 400 is sensed by a pressure sensor 408 inside the exposure device 400 and is controlled by a vacuum pressure controller 406 that is coupled to the exposure device 400. In some embodiments, the reflective mask 205c is consistent with the reticle 80 described below with respect to FIG. 5A. In some embodiments, the reflective mask 205c is mounted on a reticle stage 402. In some embodiments, the vacuum pressure controller 406 is included in the wafer exchange controller 240 of FIG. 2.

FIGS. 5A and 5B show cross-sectional views of a reflective reticle structure 80 and projecting the reflective reticle structure 80 on a semiconductor device 34 in an exposure device. FIG. 5A shows the cross-sectional view 500 of the reticle 80, e.g., a reflective reticle or mask. As noted above, the terms mask, photomask, and reticle may be used interchangeably. The reflective reticle structure 80 is consistent with reflective mask 205c of FIG. 4 and is used in the exposure device 400 of FIG. 4. As shown in FIG. 5A, the reticle 80 includes a substrate 30 with a suitable material, such as a low thermal expansion material or fused quartz. In various examples, the material includes $TiO_2$ doped $SiO_2$, or other suitable materials with low thermal expansion. The mask includes multiple reflective layers (ML) 35 deposited on the substrate 30. The ML includes a plurality of film pairs, film 37 and film 39, such as molybdenum-silicon (Mo/Si) film pairs (e.g., a layer of molybdenum above or below a layer of silicon in each film pair). Alternatively, the ML 35 may include molybdenum-beryllium (Mo/Be) film pairs, or other suitable materials that are configurable to highly reflect the EUV light. The mask may also include a capping layer 40, such as ruthenium (Ru), disposed on the ML for protection. The mask further includes an absorption layer 45, such as a tantalum boron nitride (TaBN) layer, deposited over the ML. The absorption layer 45 is patterned to define a layout pattern 55 for a layer of an integrated circuit (IC). Alternatively, another reflective layer may be deposited over the ML and is patterned to define a layer of an integrated circuit, thereby forming an EUV phase shift mask.

FIG. 5B shows exposing the photo resist layer disposed over a semiconductor device to radiation. FIG. 5B is a simplified drawing consistent with FIG. 4 for projecting a reflected mask on a substrate. FIG. 5B also shows the semiconductor device 34 that includes a photo resist layer 15 that is disposed on a semiconductor substrate 10 and is consistent with the semiconductor substrate 10 of FIG. 4. FIG. 5B further shows a radiation beam 50 that is originated from an EUV radiation source, e.g., EUV radiation source 100 of FIG. 4. The radiation beam 50 is directed to the reticle 80, e.g., a reflective photomask, where the reflected beam 50' is reflected from the reflective photomask 80 and is incident onto the photo resist layer 15 of the semiconductor device 34. The incident angle of the reflected beam 50', which is defined with respect to a line 302 that is perpendicular to a top surface of the semiconductor substrate 10 is an angle A. In some embodiments, the semiconductor substrate 10, that is consistent with the semiconductor substrate 10 of FIG. 4, is mounted on stage 560 that is coupled to and controlled by a stage controller 565 for moving the semiconductor device 34 and exposing different locations of the semiconductor device 34. In some embodiments, as described, the exposure configuration 550 of FIG. 5B is part of the exposure device 400 of FIG. 4.

Figure 6:
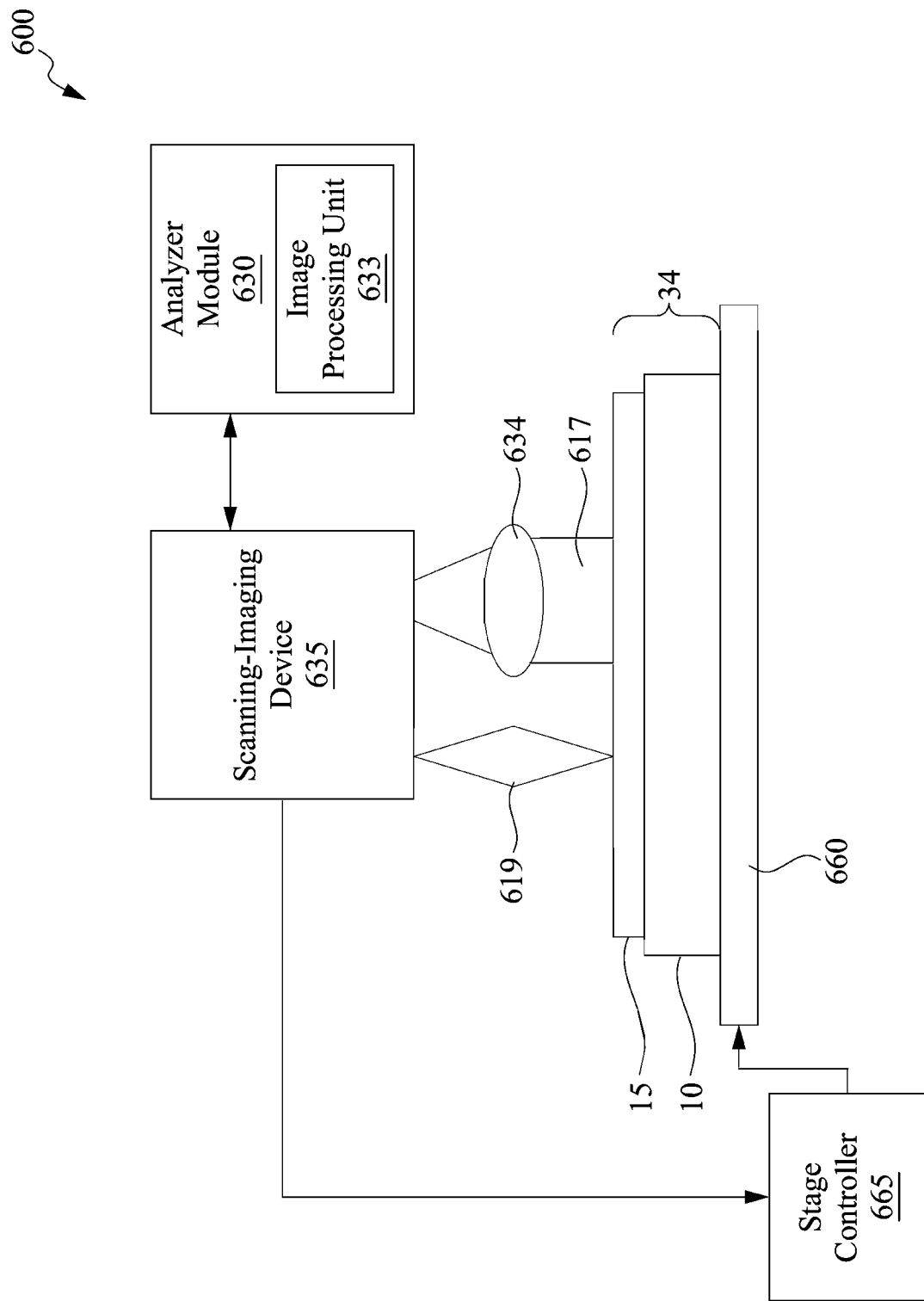
FIG. 6 shows an inspection system of the photo resist pattern disposed on a semiconductor substrate.

FIG. 6 shows an inspection system 600 of the photo resist pattern disposed on a semiconductor substrate 10. FIG. 6 shows the semiconductor device 34 on a stage 660 and the stage 660 is coupled to and controlled by a stage controller 665. As described with respect to FIG. 2, after the reticle is cleaned at the treatment device 212, the reticle is loaded as the reflective mask 205c to the exposure device 400. In some embodiments, the semiconductor substrate 10 of FIG. 4 is the semiconductor device 34 of FIG. 5B and the reflective mask 205c is irradiated with the radiation beam of the radiation source 100 to project the layout patterns of the reflective mask 205c onto the photo resist layer 15 of the semiconductor device 34 to produce a resist pattern in the photo resist layer 15. In some embodiments, prior to the exposure, the semiconductor substrate 10 including the photo resist layer 15 is baked in the PAB operation 104 to drive out solvent in the resist material and solidify the photo resist layer 15. In some embodiments, after the exposure, the PEB operation 110 is performed on the photo resist layer 15. In some embodiments, after the PEB operation 110, the development operation 112 is applied to the photo resist layer 15 to produce the resist pattern in the photo resist layer 15.

FIG. 6 also shows a scanning-imaging device 635 that generates a focusing beam 619 for scanning a top surface of the photo resist layer 15 and generating an image of the resist pattern at the top surface of the photo resist layer 15. In addition, FIG. 6 shows the scanning-imaging device 635 and a lens 634 that generates a uniform beam 617 for imaging a top surface of the photo resist layer 15 and generating the image of the resist pattern on the top surface of the photo resist layer 15. In addition, the scanning-imaging device 635 is coupled to an analyzer module 630 that includes an image processing unit 633 to receive and process the generated image of the top surface of the photo resist layer 15. In some embodiments, the generated image of the resist pattern on the top surface of the photo resist layer 15 is inspected. In some embodiments, the image processing unit of the analyzer module 630 performs one or more image processing and/or image recognition algorithms on the generated image of the top surface of the photo resist layer 15 and determines a CD measurement of the resist pattern produced in the photo resist layer 15. In some embodiments, the focusing beam 619 and the uniform beam 617 are light beams. In some embodiments, the focusing beam 619 is an electron beam. In some embodiments, as described before, the semiconductor device 34 is placed on the stage 660 and the stage controller 665 of the stage 660 moves the semiconductor device 34 with respect to the scanning-imaging device 635. In some embodiments, the stage controller 665 coordinates the scanning-imaging device 635 and the movement of the semiconductor device 34 that is placed on the stage 660 and enables the scanning-imaging device 635 to capture one or more images of the developed resist pattern of the photo resist layer 15 disposed on the semiconductor device 34 at different locations of the semiconductor device 34.

In some embodiments, the analyzer module 630 or the image processing unit 633 of the analyzer module 630 also determines a CD uniformity (CDU) of the developed resist pattern of the photo resist layer 15. If the determined CDU satisfies a predetermined criterion, e.g., if the CDU is better than one percent, the analyzer module 630 determines that the predetermined amount of time to clean the surface of the reticle from particles and/or hydrocarbon contamination and/or remedy the deposited oxide and the modified composition of the top layers of the reticle is enough, e.g., is acceptable. However, if the CDU does not satisfy the predetermined criterion, the analyzer module 630 determines that the predetermined amount of time to clean the surface of the reticle from particles and/or hydrocarbon contamination or to remedy the deposited oxide and the modified composition of the top layers of the reticle is not enough, e.g., is not acceptable, and should be increased. In some embodiments, the analyzer module 630 gradually increases the predetermined amount of time, e.g., the predetermined amount of time is increased in steps of, for example, between about 2 percent to about 10 percent. After each step of increasing the predetermined amount of time, the CDU is measured and if the CDU satisfies the predetermined criterion, the increase does not continue and the predetermined amount of time is decided as the amount of time that CDU satisfies the predetermined criterion. In some embodiments, the predetermined amount of time depends on the details of the layout pattern of the mask and whether specific shapes or features, e.g., holes, exist in the layout pattern of the mask.

In some embodiments, the analyzer module 630 determines that the predetermined amount of time to clean the surface of the reticle from particles and/or hydrocarbon contamination or remedy the deposited oxide and the modified composition of the top layers of the reticle is acceptable, however, the predetermined amount of time may be more than the time to satisfy the predetermined criterion. In some embodiments, the analyzer module 630 gradually decreases the predetermined amount of time, e.g., the predetermined amount of time is decreased in steps of, for example, between about 2 percent to about 10 percent. After each step of decreasing the predetermined amount of time, the CDU is measured and when at the step that the CDU does not satisfy the predetermined criterion, the decrease does not continue and the predetermined amount of time is decided as the amount of time before the immediate decrease that caused the CDU to dissatisfy the predetermined criterion. In some embodiments, the decided predetermined amount of time is increased by a predetermined percentage, e.g., between about 0.5 percent to about 1.5 percent, to increase reliability.

Figure 7A:
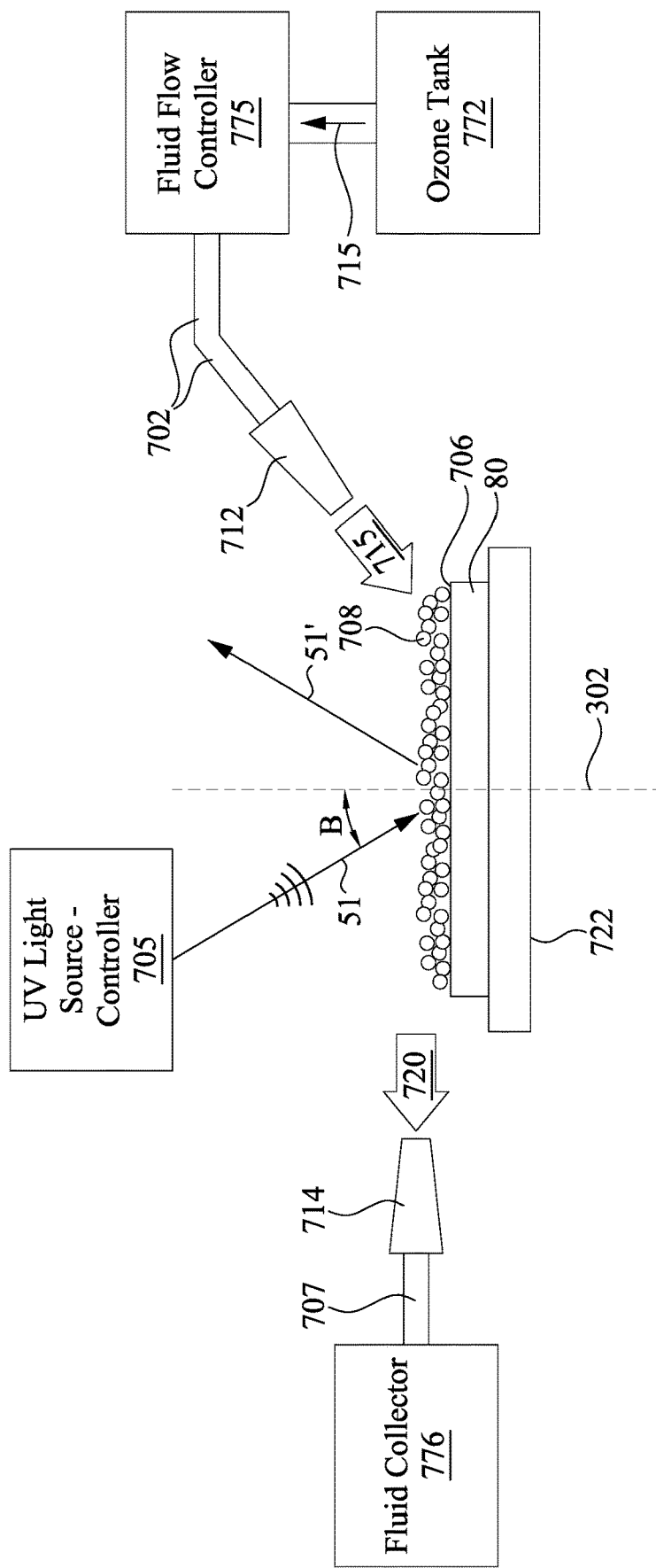
FIGS. 7A, 7B, 7C, 7D, and 7E show treatment devices for treatment of a reticle, detecting the reflected light from a reflective reticle during treatment, and displaying the composition of the top layers of the reticle before and after the treatment in accordance with some embodiments of the present disclosure.
Figure 7B:
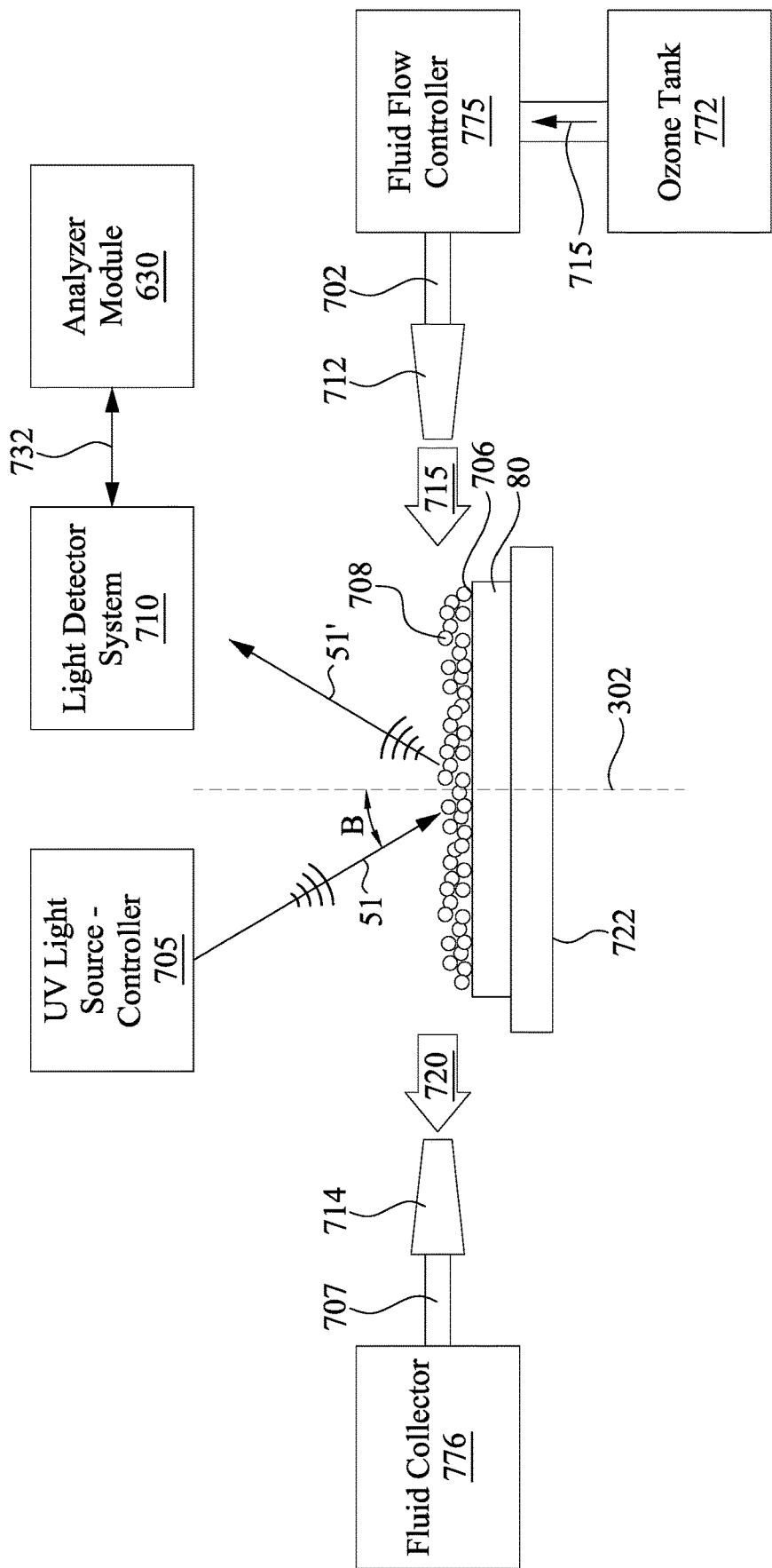
Figure 7C:
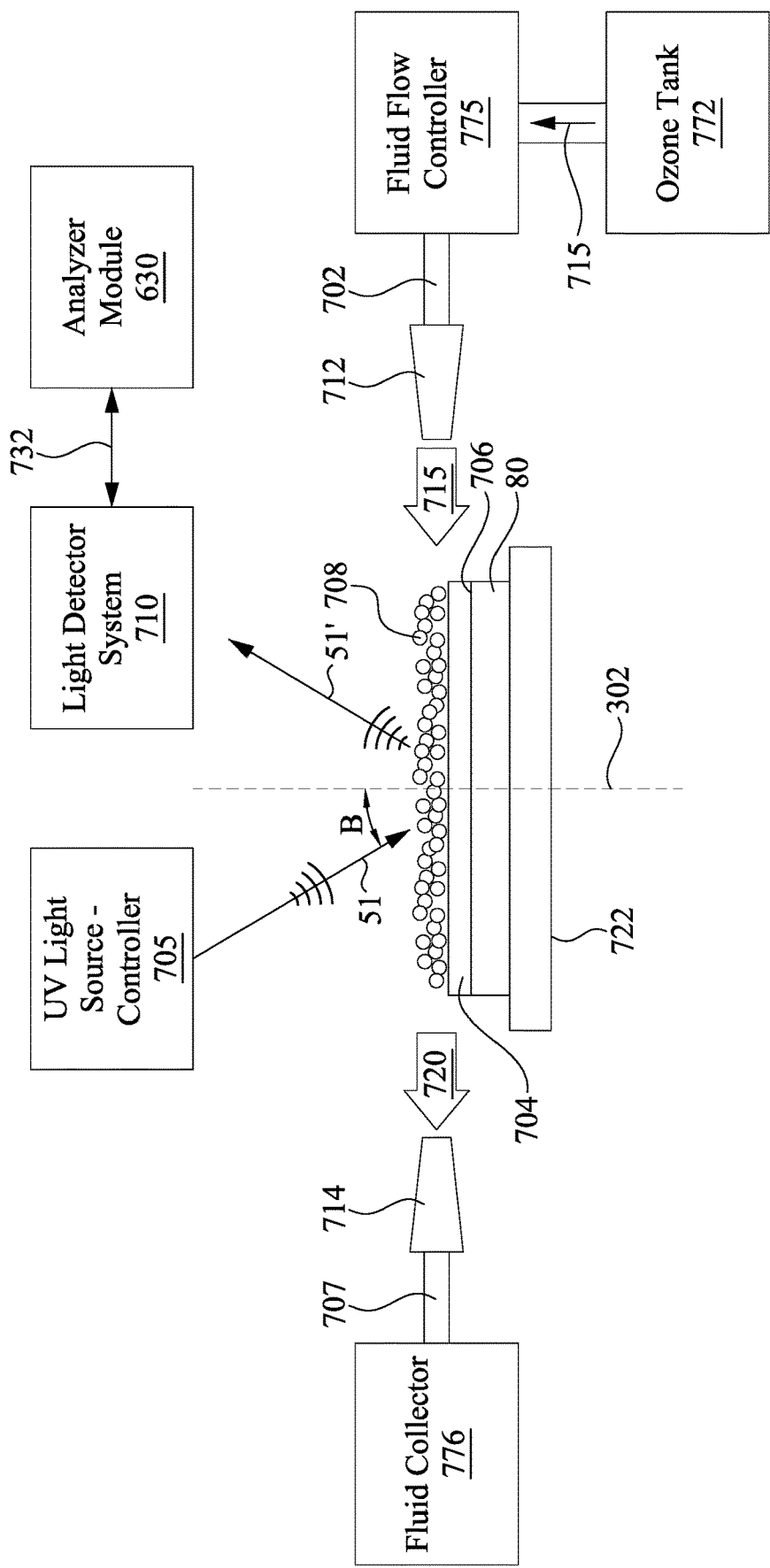
Figure 7D:
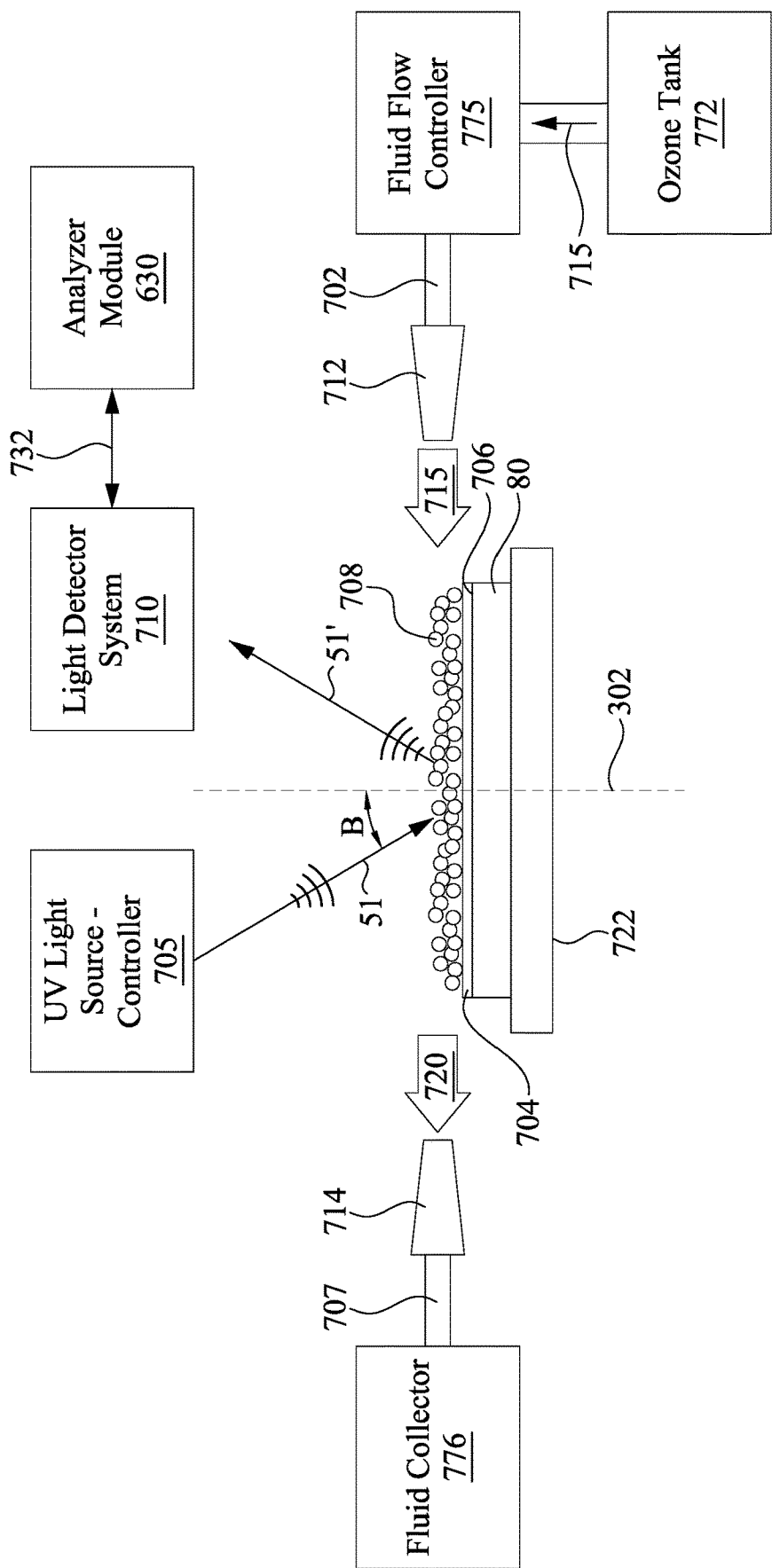

FIGS. 7A, 7B, 7C, 7D, and 7E show treatment devices for treatment of a reticle, detecting the reflected light from a reflective reticle during treatment, and displaying the composition of the top layers of the reticle before and after the treatment in accordance with some embodiments of the present disclosure. The treatment device of FIG. 7A shows irradiating the reticle 80 with a UV radiation beam 51, an incident light beam, from a UV light source-controller 705. In some embodiments, the UV light source—controller 705 generates the UV radiation beam 51, e.g., a UV light beam, at an incident angle B with respect to a line 302 that is perpendicular to a surface 706 of the reticle 80. In some embodiments, the reticle 80 is a reflective reticle and a reflected UV radiation beam 51' reflects back from the surface 706 of the reticle 80. As shown in FIG. 7A, a fluid flow controller 775 generates a fluid flow 715 from an ozone tank 772. The fluid flow 715 is delivered via a pipe 702 and a nozzle 712 to the surface 706 of the reticle 80. In some embodiments, the ozone tank 772 contains ozone, the fluid flow 715 is an ozone fluid flow, and ozone molecules 708 are delivered, e.g., released, over the surface 706 of the reticle 80. In some embodiments, the ozone molecules 708 are distributed over the surface 706 of the reticle 80 when the surface 706 of the reticle 80 is irradiated with the UV radiation beam 51. In some embodiments, the distributed ozone molecules 708 over the surface 706 of the reticle 80, enhances the cleaning of the surface 706 of the reticle from particles and/or hydrocarbon contamination and also improves the cure of the deposited oxide and the modified composition of the top layers of the reticle 80. In some embodiments, the UV light source-controller 705 has a wavelength between about 100 nm and about 400 nm. As describe, in some embodiments, the reticle 80 is a reflective EUV reticle and between about 50 percent to 90 percent of the incident UV radiation beam 51 is reflected back from the surface 706 of the reticle 80 to generate the reflected UV radiation beam 51' and the rest of the incident UV radiation beam 51 goes through the reticle 80. In some embodiments, the incident UV radiation beam 51 irradiates a first region of a plurality of at least partially non-overlapping regions on the surface 706 of the reticle 80 and treats, e.g., remedies or cures, the first region of the surface 706 of the reticle 80. In some embodiments, the reticle stage 722 that is consistent with the reticle stage 402 of FIG. 4 moves and the incident UV radiation beam 51 scans and treats an entire surface 706 of the reticle 80. In some embodiments, the UV light source—controller 705 changes the incident angle B of the incident UV radiation beam 51 to scan and treat the entire surface 706 of the reticle 80. In some embodiments, a remaining amount of the delivered ozone fluid flow 715 is collected as a fluid flow 720 by a fluid collector 776. The fluid flow 720 is collected via a nozzle 714 and a pipe 707 connected between the nozzle 714 and fluid collector 776. In some embodiments, as shown in FIG. 7A, the surface 706 of the reticle 80 is covered with ozone fluid. In some embodiments, the fluid flows 715 and 720 are ozone water, e.g., ozone gas dissolved in water, and ozone water covers the surface of the reticle 80 when the incident UV radiation beam 51 irradiates the surface 706 of the reticle 80. Thus, in some embodiments, the ozone tank 772 is an ozone water tank and the fluid flow controller 775 controls the flow of the ozone water from the ozone tank 772 to the surface 706 of the reticle 80 and the ozone molecules 708 on the surface 706 of the reticle 80 are dissolved in water (not shown). In some other embodiments, the ozone tank 772 is an ozone gas tank, the fluid flows 715 and 720 are ozone gas and the ozone molecules 708 are provided as ozone gas to the surface 706 of the reticle 80.

FIG. 7B shows a treatment device consistent with the treatment device of FIG. 7A. FIG. 7B additionally includes a light detector system 710 that includes at least one light detector and focusing optics, e.g., a lens, and is coupled to the analyzer module 630. In some embodiments, the reflected UV radiation beam 51' is focused on a single point by the light detector system 710 and the light detector system 710 detects and generates a light signal 732 proportional to the detected light and sends the detected light signal 732 to the analyzer module 630. In some embodiments, the treatment of the ozone covered surface 706 of the reticle 80, remedies the deposited oxide and the modified composition of the top layers of the reticle 80 that are not covered by the absorption layer 45 and increases an intensity of the reflected UV radiation beam 51' and, thus, increases the detected light signal 732. The temporal variation of the detected light signal 732 is described with respect to FIG. 7E.

FIGS. 7C and 7D show treatment devices that are consistent with the treatment device of FIG. 7B. FIGS. 7C and 7D additionally show a contamination layer 704 containing hydrocarbon contamination or particles that is deposited over the surface 706 of the reticle 80 where the incident radiation beam 51 enters the reticle 80. In addition to the deposited oxide and the modified composition of the top layers of the reticle 80, the contamination layer 704 may further reduce the intensity of the reflected beam 50' in FIG. 5B and may further degrade the projected image during lithography and may degrade CD uniformity. In some embodiments, irradiating the ozone covered contamination layer 704 with the UV radiation beam 51 decomposes the contamination layer 704. As shown in the progression from FIG. 7C to FIG. 7D, the contamination layer 704 is decomposed and becomes thinner and the intensity of the reflected light from the surface 706 of the reticle 80 is increased. In addition to decomposing the contamination layer 704, the UV radiation beam 51 may also cure the deposited oxide and the modified composition of the top layers of the reticle 80 during and after the decomposition of the contamination layer 704 and, thus, may further increase the reflected light from the surface 706 of the reticle 80.

In some embodiments, irradiating the ozone covered reticle 80 with the UV radiation beam 51 and determining the CDU may be performed in multiple steps where each step may last between about 10 seconds to 50 seconds. After each step, the CDU is determined as described above. If the CDU is determined to be below a threshold CDU, the treatment of reticle 80 becomes complete. In some embodiments, the threshold CDU is about one to two percent in 3 nm process for 3 nm semiconductor node.

Figure 7E:
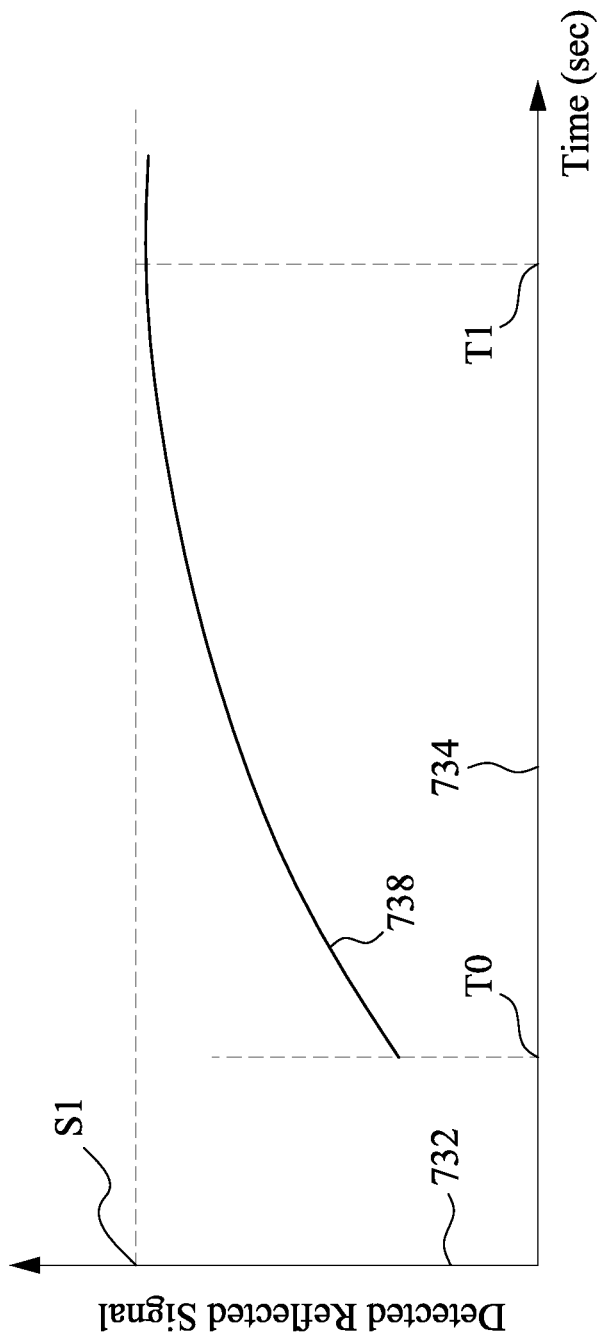

FIG. 7E shows a time variation, on temporal coordinate 734, of the detected reflected light signal 732, from a region on the surface 706 of the reticle 80. As shown in FIG. 7E, the reflected intensity from the specific region increases in time until a time T1 that the intensity curve saturates at level Si and does not increase further. The curve 738 is an indication that at the specific region of the surface 706 of the reticle 80, the contamination layer 704 existed and/or the deposited oxide and the modified composition of the top layers of the reticle 80 existed. The temporal change of the curve 738 also indicates that the contamination layer 704 is decomposed and/or the deposited oxide and the modified composition of the top layers of the reticle 80 is cured. As discussed, the procedure shown in FIGS. 7A, 7B, 7C, and 7D enhances, e.g., increases, the reflectivity of the surface 706 of the reticle 80, increases the reflected light from the surface 706 of the reticle 80 and, thus, the required time for the lithography operation may be reduced. In some embodiments, the exposure time of the lithography operation is inversely proportional to the reflectivity of the reticle 80.

In some embodiments, the time T1 is the predetermined amount of time that is needed to clean and cure the surface 706 of the reticle 80 and further irradiating the reticle 80 does not improve the reflected light intensity. In some embodiments, when the curve 738 saturates and increases by less than a threshold value in a predefined time, e.g., the curve 738 increase by less than one percent in a predefined time between about 10 seconds and about 100 seconds, the cleaning stops and the time T1 is reached. In some embodiments, the time T1 is between about 50 seconds to about 100 seconds. In some embodiments, the time T1 is between about 2 minutes and about 10 minutes. In some embodiments, the curve 738 is constructed for multiple regions on the surface 706 of the reticle 80, the time T1 is measured for the multiple regions, and a final T1 is determined as the maximum of the measured T1s. In some embodiments, a minimum time for each step of cleaning and/or treatment is T0, e.g., 10 seconds and, thus, the curve 738 begins at the time T0. In some embodiments, as described above, the reflectivity of the surface 706 of the reticle 80 is determined using a UV light source and the determined cleaning and/or treatment time is used for cleaning and/or treatment of the reticle 80 with the UV light source, however, a lithography system that uses an EUV light source uses the cleaned and treated reticle 80.

In some embodiments, after about 20 lithography operations, the reflected light intensity from the surface 706 of the reticle 80 is reduced from about 20 mili-joules to about 17.4 mili-joules as measured by the light detector system 710 of FIG. 7B, however, after the treatment the reflected light intensity is increased to about 18.6 mili-joules. Thus, in some embodiments, the treatment does not completely cure the deposited oxide and the modified composition of the top layers of the reticle 80, however, the treatment completely removes the contamination layer 704.

Figure 8:
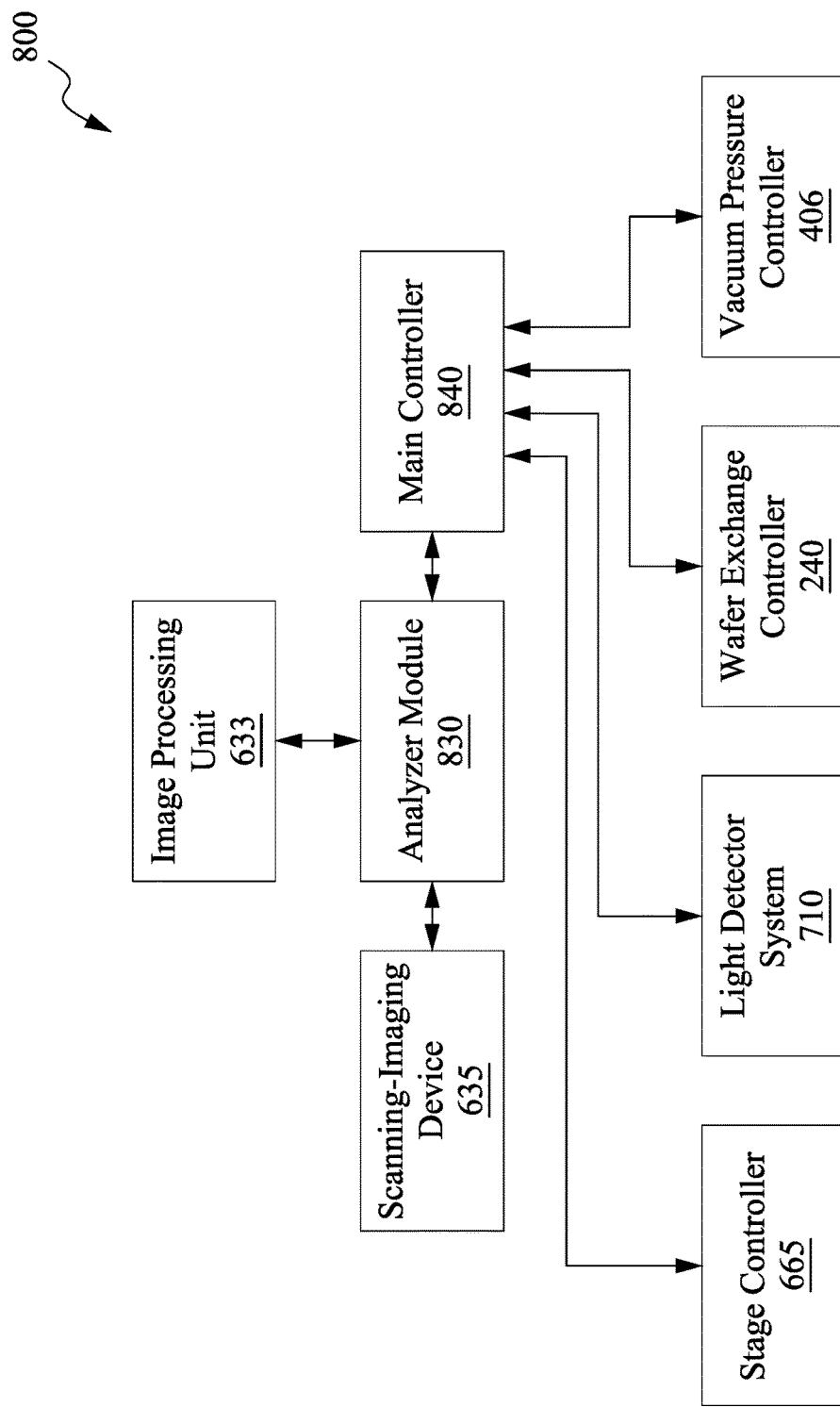
FIG. 8 shows a control system for treatment of a reticle and projecting layout patterns of the treated reticle on a semiconductor substrate in accordance with some embodiments of the present disclosure.

FIG. 8 shows a control system 800 for treatment of a reticle and projecting layout patterns of the treated reticle on a semiconductor substrate in accordance with some embodiments of the present disclosure. The control system 800 includes an analyzer module 830 and a main controller 840 coupled to each other. In some embodiments, the control system 800 includes the stage controller 665 of FIG. 6, the light detector system 710 of FIG. 7B, the wafer exchange controller 240 of FIG. 2, the scanning-imaging device 635 of FIG. 6, and the vacuum pressure controller 406 of FIG. 4. In some embodiments, the main controller 840 is coupled to and controls the stage controller 665, the light detector system 710, the wafer exchange controller 240, the scanning-imaging device 635, and the vacuum pressure controller 406. In some embodiments, the main controller 840 is directly coupled to the scanning-imaging device 635 or is coupled to the scanning-imaging device 635 via the analyzer module 830. In some embodiments, the treatment of the reticle 80 includes the cleaning of the surface 706 of the reticle 80.

In some embodiments, the analyzer module 830 is consistent with or includes the analyzer module 630 of FIG. 6. In some embodiments, the main controller 840 commands the scanning-imaging device 635, via the analyzer module 830, to capture an image of the resist pattern on a semiconductor substrate and determine, e.g., measure, the CDU of the resist pattern disposed on the semiconductor substrate. As described above, the analyzer module 830 determines, based on the measured CDU, if the surface of the reticle is cleaned and or treated. In some embodiments, the main controller 840 commands the stage controller 665 to move the stage 660 to capture one or more images of the resist pattern disposed on the semiconductor substrate at different locations. In some embodiments, the main controller 840 commands the vacuum pressure controller 406 to maintain a vacuum environment inside the treatment device 212 and the exposure device 214 and to maintain a vacuum environment inside the reticle library 202. In some embodiments, the main controller 840 commands the wafer exchange controller 240 to clean and/or treat a surface of the reticle in a treatment device 212 and to load the cleaned and treated reticle to the exposure device 214 and project the layout pattern of the reticle 80 on a photo resist layer of the semiconductor substrate 10. In some embodiments, the main controller 840 commands the light detector system 710 to capture a reflected light from the reticle during the cleaning and or treating of the reticle 80 and to transfer the detected reflected light to the analyzer module 830 for analysis. As described before, the analyzer module 830 includes or is coupled to the image processing unit 633 and the image processing unit 633.

Figure 9:
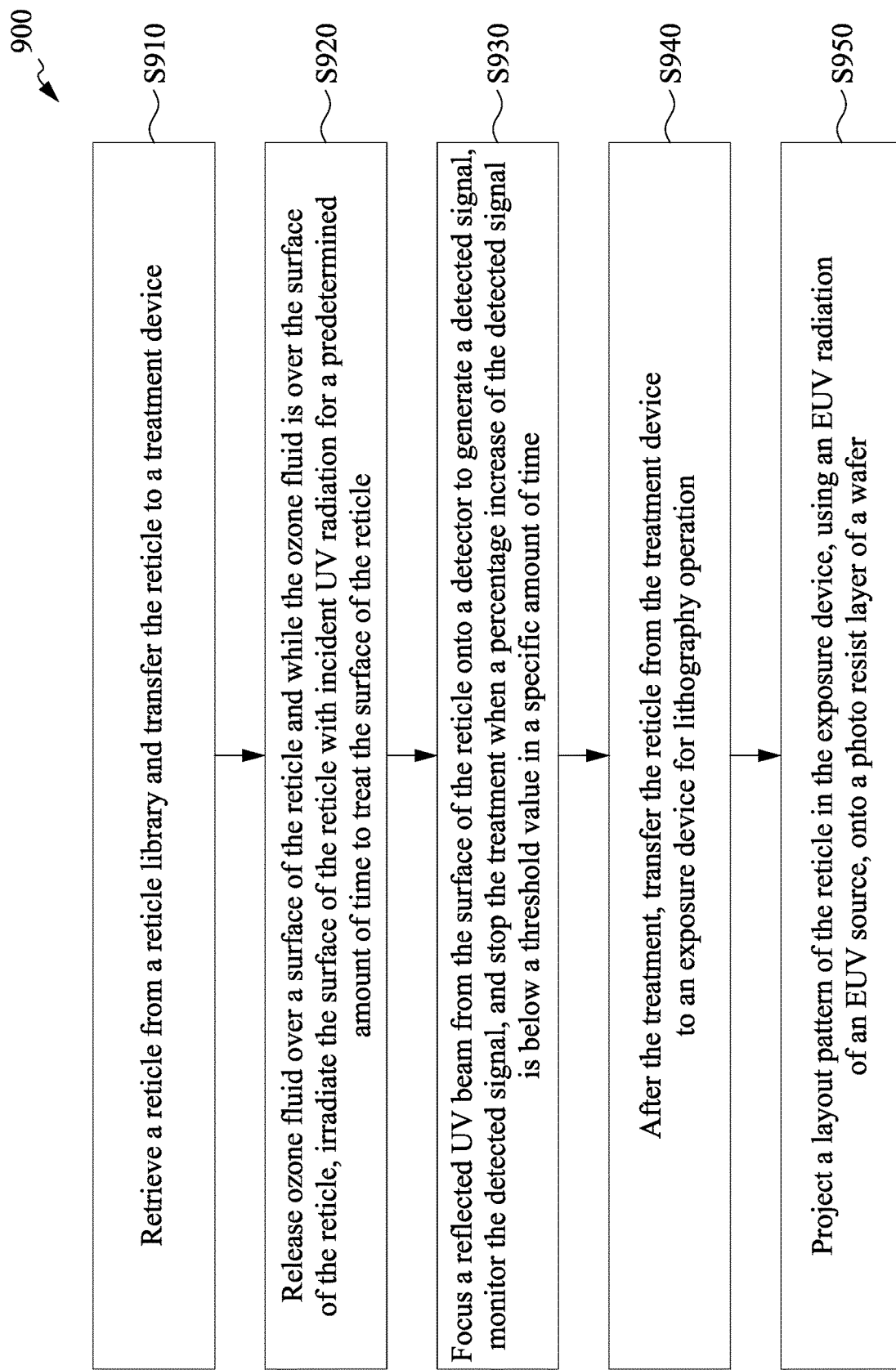
FIG. 9 shows a process of an exemplary process for treatment of a reticle and projecting layout patterns of the treated reticle on a semiconductor substrate in accordance with some embodiments of the present disclosure.

FIG. 9 shows a process 900 of an exemplary process for treatment of a reticle and projecting layout patterns of the treated reticle on a semiconductor substrate in accordance with some embodiments of the present disclosure. The process 900 or a portion of the process 900 may be performed by the system of FIG. 2. In some embodiments, the process 900 or a portion of the process 900 is performed and/or is controlled by the computer system 1000 described below with respect to FIGS. 10A and 10B. In some embodiments, the process 900 or a portion of the process 900 is performed by the control system 800 of FIG. 8 described above. The method includes an operation 5910, where a reticle is retrieved from a reticle library and is transferred to a treatment device. As shown in FIG. 2, a reticle is retrieve by the robot arm of the robot device 206 from the reticle library 202. After the retrieval of the reticle, the robot arm delivers the reticle to the treatment device 212.

In operation 5920, a surface of the reticle is treated by releasing ozone fluid over the surface of the reticle and irradiating the surface of the reticle by UV radiation of a UV source for a predetermined amount of time. As shown in FIGS. 7A, 7B, and 7C, the surface 706 of the reticle 80 is treated, in the treatment device 212, to remove the contamination layer 704 and or to cure the deposited oxide and the modified composition of the top layers of the reticle 80. As shown in FIGS. 7B and 7D, the surface of the reticle 80 is cleaned from the contamination layer 704 and/or is cured for deposited oxide and the modified composition of the top layers of the reticle 80. In some embodiments, the treatment includes focusing a reflected UV beam from the surface of the reticle onto a detector of the light detector system 710 to generate a detected signal and sending the detected signal, via the main controller 840, to the analyzer module 830 such that the analyzer module 830 monitors the detected signal during the irradiation time. In some embodiments, the analyzer module 830 sends a signal to the main controller to stop the irradiation time and to stop the treatment of the surface of the reticle when a percentage increase of the detected signal is below a threshold value in a specific amount of time.

In operation 5930, a reflected UV beam from the surface of the reticle is focused onto a detector to generate a detected signal, the detected signal is monitored, and the treatment is stopped when a percentage increase of the detected signal is below a threshold value in a specific amount of time. As shown in FIG. 7B, the reflected beam 51' is focused on a detector of the light detector system 710 and the light signal 732 is generated. The detected light signal 732 is transferred to the analyzer module 630 and is monitored by the analyzer module 630. When the analyzer module 630 determines that the percentage increase of the detected light signal 732 is below a threshold, e.g., below 1 percent, in a duration of time of about 20 seconds, the treatment ends and the UV radiation beam 51 is turned off, the ozone fluid flow 715 is turned off, and the remaining amount of the delivered ozone fluid flow 715 is collected as the fluid flow 720 by the fluid collector 776.

In operation 5940, after the treatment, the reticle is transferred from the treatment device to an exposure device for lithography operation. As shown in FIG. 2, after treating the reticle, the reticle is transferred from the treatment device 212 to the exposure device 214. The reticle is transferred by the robot arm of the robot device 206. In the exposure device 214 the lithography operation is performed and the layout patterns of the reticle 80 is projected on a wafer.

In operation 5950, in the exposure device, a layout pattern of the reticle is projected onto a photo resist layer of a wafer. As shown in FIG. 4 or 5B, the layout pattern of the respective reflective mask 205c or 80 is projected onto a photo resist layer of the respective semiconductor substrate 10.

Figure 10A:
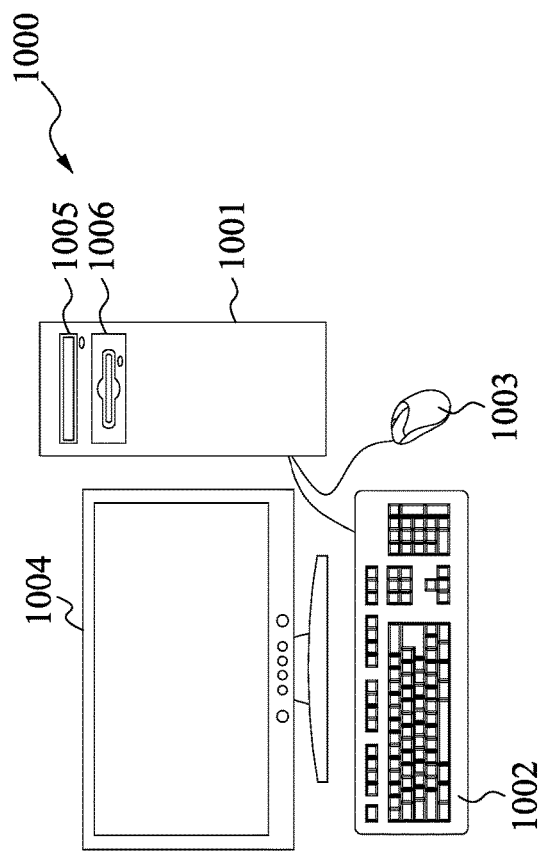
FIGS. 10A and 10B illustrate an apparatus for treatment of a reticle and projecting layout patterns of the treated reticle on a semiconductor substrate in accordance with some embodiments of the present disclosure.
Figure 10B:
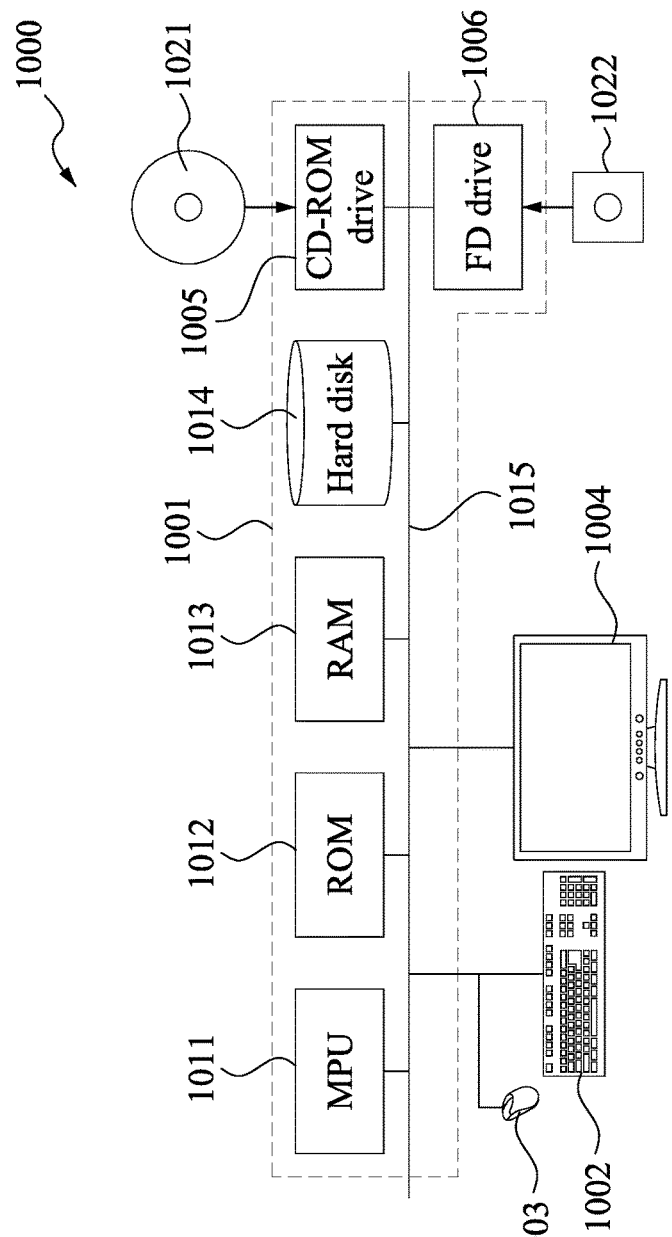

FIGS. 10A and 10B illustrate an apparatus for treatment of a reticle and projecting layout patterns of the treated reticle on a semiconductor substrate in accordance with some embodiments of the present disclosure. FIGS. 10A and 10B illustrate an apparatus for treating a reticle and projecting layout patterns of the cleaned reticle on a semiconductor substrate in accordance with some embodiments of the present disclosure. In some embodiments, the computer system 1000 is used for performing the functions of the modules of FIG. 8 that include the main controller 840, the analyzer module 830 or 630, the stage controller 665, the wafer exchange controller 240, the vacuum pressure controller 406, and the image processing unit 633 of the analyzer module 630. In some embodiments, the computer system 1000 is used to execute the process 900 of FIG. 9.

FIG. 10A is a schematic view of a computer system that performs the functions of an apparatus for treating reticles and projecting layout patterns of the treated reticles. All of or a part of the processes, method and/or operations of the foregoing embodiments can be realized using computer hardware and computer programs executed thereon. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 1000 to execute the functions for treating the reticles and projecting layout patterns of the treated reticles in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the control system for treating the reticles and projecting layout patterns of the treated reticles in the foregoing embodiments. The program may only include a command portion to call an appropriate function (module) in a controlled mode and obtain desired results.

According to some embodiments of the present disclosure, a method of treating a surface of a reticle for semiconductor manufacturing includes retrieving a reticle from a reticle library, transferring the reticle to a treatment device, and releasing ozone fluid over a surface of the reticle. The method also includes that while the ozone fluid is over the surface of the reticle the surface of the reticle is irradiated with an incident ultraviolet (UV) radiation for a predetermined irradiation time to treat the surface of the reticle. The method includes that after the treatment, the reticle is transferred to an exposure device for lithography operation to generate a photo resist pattern on a wafer. The method further includes imaging a surface of the wafer to generate an image of the photo resist pattern on the wafer, analyzing the generated image of the photo resist pattern to determine critical dimension uniformity (CDU) of the photo resist pattern, and increasing the predetermined irradiation time if the determined CDU does not satisfy a threshold CDU. In an embodiment, the ozone fluid is either an ozone water or an ozone gas, the method further includes maintaining the treatment device, the exposure device, and the reticle library under vacuum environment. In an embodiment, the reticle is retrieved from the reticle library and is transferred to the treatment device by a robot arm of a wafer exchange system, and the method further includes transferring the reticle from the treatment device to the exposure device by the robot arm. In an embodiment, the method further includes projecting, by an incident EUV radiation, a layout pattern of the reticle onto a photo resist layer of the wafer, and developing the photo resist layer to generate the photo resist pattern on the wafer. In an embodiment, the incident UV radiation is generated from a UV source of the treatment device and the incident EUV radiation is generated from an EUV source of the exposure device. In an embodiment, the threshold CDU is between one to two percent in 3 nm process for 3 nm semiconductor node. In an embodiment, the method further includes repeating the treatment, the projecting, the developing, the imaging, the analyzing, and the increasing a irradiation time, until the determined CDU satisfies the threshold CDU, and adjusting the predetermined irradiation time to the irradiation time that corresponds to the threshold CDU.

According to some embodiments of the present disclosure, a method of treating a surface of a reticle for semiconductor manufacturing includes performing a treatment of a surface of a reflective reticle in a treatment device. The treatment includes releasing ozone fluid over the surface of the reticle. The treatment further includes focusing a reflected UV beam from the surface of the reticle onto a detector to generate a detected signal, monitoring the detected signal during the irradiation time, and stopping the treatment of the surface of the reticle and ending the irradiation time when a percentage increase of the detected signal in a specific amount of time is below a threshold value. The method also includes transferring the reticle, after the treatment, from the treatment device to an exposure device for lithography operation. The method further includes projecting a layout pattern of the reticle in the exposure device, using an incident extreme UV (EUV) radiation of an EUV source, onto a photo resist layer of a wafer. In an embodiment, the method further includes developing the photo resist layer, after the projecting, to generate a photo resist pattern on the wafer. In an embodiment, the treatment further includes irradiating a first region of two or more at least partially non-overlapping regions on the surface of the reticle by the incident UV beam to treat the first region on the surface of the reticle, focusing a reflected UV beam from the first region of the surface of the reticle onto the detector to generate the detected signal, monitoring the detected signal during the irradiation time, and stopping the treatment of the first region when the percentage increase of the detected signal is below the threshold value in the specific amount of time. In an embodiment, the two or more at least partially non-overlapping regions cover an entire surface of the reticle, the treatment further includes performing the irradiating, the focusing, the monitoring, and the stopping on other regions of the two or more at least partially non-overlapping regions on the surface of the reticle to treat the entire surface of the reticle. In an embodiment, the UV source of the treatment device produces UV radiation with a wavelength between 100 nm and 300 nm and the method further includes stopping the treatment of the first region when the detected signal increases less than one percent in 20 seconds. In an embodiment, the EUV source of the exposure device produces EUV radiation at a wavelength of 13.5 nm. In an embodiment, the method further includes maintaining the exposure device and the treatment device under a vacuum environment.

According to some embodiments of the present disclosure, a semiconductor manufacturing system includes a main controller, an analyzer module coupled to the main controller, and a wafer exchange system having an extendable robot arm. The system includes a treatment device that includes a first reticle stage for mounting a reticle, an ultra violet (UV) light source, and a light detector system including a light detector. The system further includes an exposure device that includes a second reticle stage for mounting the reticle, an extreme ultra violet (EUV) light source, a stage for holding a wafer, and an optical system. The main controller commands the UV light source to turn on, to irradiate UV radiation from the UV light source, and to treat a surface of the reticle in the first reticle stage of the treatment device by irradiating the surface of the reticle by the UV radiation of the UV source. The main controller allows release of ozone fluid from an ozone supply line over the surface of the reticle during the irradiation with the UV radiation. The main controller commands the light detector system of the treatment device to focus a reflected UV beam from the surface of the reticle onto the light detector of the light detector system to generate a detected signal and to send the detected signal to the analyzer module. The analyzer module monitors the detected signal during an irradiation time and sends a command via the main controller to the UV light source to stop a treatment of the surface of the reticle when a percentage increase of the detected signal is below a threshold value in a specific amount of time. After the treatment, the main controller commands the wafer exchange system to transfer the reticle, by the extendable robot arm, from the treatment device to the second reticle stage of the exposure device for lithography operation. Moreover, after the transferring, the main controller commands the EUV light source to turn on, to irradiate EUV radiation from the EUV light source, and to project a layout pattern of the reticle, through the optical system, onto a photo resist layer of the wafer. In an embodiment, the system further includes a development system to develop the photo resist layer of the wafer after the projection of the layout pattern of the reticle and to generate a photo resist pattern on the wafer. In an embodiment, the exposure device further includes an imaging device mounted over the stage for holding a wafer. In response to a command from the main controller, the imaging device captures an image of the developed photo resist pattern on the wafer and transfers the captured image to the analyzer module. The analyzer module determines a critical dimension uniformity (CDU) of the photo resist pattern on the wafer. In an embodiment, the system further includes a reticle library to hold a plurality of reticles, and a pressure controller coupled to the main controller. The pressure controller maintains a pressure of the exposure device, the treatment device, and the reticle library under a vacuum environment. In an embodiment, the system further includes a reticle library. Prior to the irradiating the surface of the reticle by the UV radiation, the main controller sends a command to the wafer exchange system to retrieve the reticle from the reticle library and to transfer the reticle to the treatment device. In an embodiment, the EUV light sources have a wavelength of 13.5 nm and the UV light source has a wavelength between 120 nm and 250 nm. The analyzer module sends a command via the main controller to the UV light source to turn off to stop the treatment of the surface of the reticle when the detected signal increases less than one percent in 20 seconds. In some embodiments, the UV light source emits a light beam having a wavelength in the EUV range of 10 nm to 100 nm.

As described in the foregoing embodiments, the surface of a reticle is treated by decomposing the particles and a hydrocarbon layer deposited on a surface of the reticle and curing deposited oxide and the modified composition of the top layers of the reticle by UV radiation and ozone fluid. The treatment is performed with no solvent and by using the UV radiation and ozone fluid. As discussed, the treatment reduces the exposure time of the lithography operation and reduces lithography costs.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   retrieving a reticle from a reticle library;
   transferring the reticle to a treatment device;
   releasing ozone fluid over a surface of the reticle;
   while the ozone fluid is over the surface of the reticle, irradiating the surface of the reticle with an incident ultraviolet (UV) radiation for a predetermined irradiation time to treat the surface of the reticle;
   after the treatment, transferring the reticle to an exposure device for lithography operation to generate a photo resist pattern on a wafer;
   imaging a surface of the wafer to generate an image of the photo resist pattern on the wafer;
   analyzing the generated image of the photo resist pattern to determine critical dimension uniformity (CDU) of the photo resist pattern; and
   increasing the predetermined irradiation time if the determined CDU does not satisfy a threshold CDU.

2. The method of claim 1, wherein:
   the ozone fluid is either an ozone water or an ozone gas, and
   the method further comprises:
   maintaining the treatment device, the exposure device, and the reticle library under vacuum environment.

3. The method of claim 1, wherein:
the reticle is retrieved from the reticle library and is transferred to the treatment device by a robot arm of a wafer exchange system, and
the method further comprises transferring the reticle from the treatment device to the exposure device by the robot arm.

4. The method of claim 1, further comprising:
projecting, by an incident extreme UV (EUV) radiation, a layout pattern of the reticle onto a photo resist layer of the wafer; and
developing the photo resist layer to generate the photo resist pattern on the wafer.

5. The method of claim 4, wherein the incident UV radiation is generated from a UV source of the treatment device and the incident EUV radiation is generated from an EUV source of the exposure device.

6. The method of claim 4, wherein the threshold CDU is between one to two percent in 3 nm process for 3 nm semiconductor node.

7. The method of claim 6, further comprising:
repeating the treatment, the projecting, the developing, the imaging, the analyzing, and the increasing a irradiation time, until the determined CDU satisfies the threshold CDU; and
adjusting the predetermined irradiation time to the irradiation time that corresponds to the threshold CDU.

8. A method comprising:
performing a treatment of a surface of a reflective reticle in a treatment device, wherein the treatment comprises:
releasing ozone fluid over the surface of the reticle; and
while the ozone fluid is over the surface of the reticle, irradiating the surface of the
reticle by an incident ultraviolet (UV) beam of a UV source for an irradiation time to treat the surface of the reticle, wherein the treatment further comprises:
focusing a reflected UV beam from the surface of the reticle onto a detector to generate a detected signal;
monitoring the detected signal during the irradiation time; and
stopping the treatment of the surface of the reticle and ending the irradiation time when a percentage increase of the detected signal is below a threshold value in a specific amount of time;
after the treatment, transferring the reticle from the treatment device to an exposure device for lithography operation; and
projecting a layout pattern of the reticle in the exposure device, using an incident extreme UV (EUV) radiation of an EUV source, onto a photo resist layer of a wafer.

9. The method of claim 8, further comprising:
after the projecting, developing the photo resist layer to generate a photo resist pattern on the wafer.

10. The method of claim 8, wherein the treatment further comprises;
irradiating a first region of two or more at least partially non-overlapping regions on the surface of the reticle by the incident UV beam to treat the first region on the surface of the reticle;
focusing a reflected UV beam from the first region of the surface of the reticle onto the detector to generate the detected signal;
monitoring the detected signal during the irradiation time; and
stopping the treatment of the first region when the percentage increase of the detected signal is below the threshold value in the specific amount of time.

11. The method of claim 10, wherein the two or more at least partially non-overlapping regions cover an entire surface of the reticle, the treatment further comprises:
performing the irradiating, the focusing, the monitoring, and the stopping on other regions of the two or more at least partially non-overlapping regions on the surface of the reticle to treat the entire surface of the reticle.

12. The method of claim 10, wherein the UV source of the treatment device produces UV beam with a wavelength between 100 nm and 300 nm, and wherein the method further comprises:
stopping the treatment of the first region when the detected signal increases less than one percent in 20 seconds.

13. The method of claim 8, wherein the EUV source of the exposure device produces EUV radiation at a wavelength of 13.5 nm and the UV source produces UV beam with a wavelength between 120 nm and 250 nm.

14. The method of claim 8, further comprising:
maintaining the exposure device and the treatment device under a vacuum environment.

15. A semiconductor manufacturing system, comprising:
a main controller;
an analyzer module coupled to the main controller;
a wafer exchange system having an extendable robot arm;
a treatment device comprising:
a first reticle stage configured for mounting a reticle;
an ultraviolet (UV) light source; and
a light detector system comprising a light detector;
an exposure device comprising:
a second reticle stage configured for mounting the reticle;
an extreme ultraviolet (EUV) light source;
a stage for holding a wafer; and
an optical system, wherein:
the main controller is configured to command the UV light source to turn on, to irradiate UV radiation from the UV light source, and to treat a surface of the reticle in the first reticle stage of the treatment device by irradiating the surface of the reticle by the UV radiation of the UV light source,
the main controller is configured to allow release of ozone fluid from an ozone supply line over the surface of the reticle during the irradiation with the UV radiation,
the main controller is configured to command the light detector system of the treatment device to focus a reflected UV radiation from the surface of the reticle onto the light detector of the light detector system to generate a detected signal and to send the detected signal to the analyzer module,
the analyzer module is configured to monitor the detected signal during an irradiation time, and to send a command via the main controller to the UV light source to stop a treatment of the surface of the reticle when a percentage increase of the detected signal is below a threshold value in a specific amount of time,
after the treatment, the main controller is configured to command the wafer exchange system to transfer the reticle, by the extendable robot arm, from the treatment device to the second reticle stage of the exposure device for lithography operation, and
after the transferring, the main controller is configured to command the EUV light source to turn on, to irradiate EUV radiation from the EUV light source, and to project a layout pattern of the reticle, through the optical system, onto a photo resist layer of the wafer.

16. The system of claim 15, further comprising:
a development system configured to develop the photo resist layer of the wafer after the projection of the layout pattern of the reticle and to generate a photo resist pattern on the wafer.

17. The system of claim 16, wherein the exposure device further comprises:
an imaging device mounted over the stage for holding a wafer, wherein in response to a command from the main controller the imaging device is configured to capture an image of the developed photo resist pattern on the wafer and to transfer the captured image to the analyzer module,
wherein the analyzer module is configured to determine a critical dimension uniformity (CDU) of the photo resist pattern on the wafer.

18. The system of claim 15, further comprising:
a reticle library configured to hold a plurality of reticles; and
a pressure controller coupled to the main controller, where the pressure controller is configured to maintain a pressure of the exposure device, the treatment device, and the reticle library under a vacuum environment.

19. The system of claim 15, further comprising:
a reticle library, wherein prior to the irradiating the surface of the reticle by the UV radiation, the main controller is configured to send a command to the wafer exchange system to retrieve the reticle from the reticle library and to transfer the reticle to the treatment device.

20. The system of claim 15, wherein the EUV light source emits an EUV light having a wavelength of 13.5 nm and the UV light source emits a UV light having a wavelength between 120 nm and 250 nm, and wherein the analyzer module is configured to send a command via the main controller to the UV light source to turn off to stop the treatment of the surface of the reticle when the detected signal increases less than one percent in 20 seconds.

* * * * *